Aug. 6, 1968 M. PALESI ET AL 3,395,439

APPARATUS FOR ATTACHING COMPONENTS TO A CIRCUIT BOARD

Filed Oct. 20, 1965

INVENTORS
MARIE PALESI
RICHARD J. PALESI

BY Gregg & Stidham
ATTORNEYS

United States Patent Office 3,395,439

Patented Aug. 6, 1968

3,395,439
APPARATUS FOR ATTACHING COMPONENTS TO A CIRCUIT BOARD

Marie Palesi and Richard J. Palesi, both of 794 Independence Ave., Mountain View, Calif. 94040

Filed Oct. 20, 1965, Ser. No. 498,302
8 Claims. (Cl. 29—203)

ABSTRACT OF THE DISCLOSURE

Apparatus for use in mounting electrical components having lead wires extending therefrom to an insulated circuit board having a conductive circuit pattern on at least one face thereof and holes formed through the board to accommodate the component lead wires, which apparatus comprises a frame having a pair of spaced supporting members for supporting a circuit board therebetween. The one face of the board bearing the conductive circuit pattern is faced downwardly on the frame, and the electrical components are positioned on the upper face of the board with the lead wires extending through the board. A cover with a resilient pad is adapted for engagement with the electrical components, and means are provided for urging the cover toward the circuit board with the pad against the components to clamp the same against the board. The apparatus with the components clamped to the circuit board then may be inverted for joining the lead wires to the conductive circuit of the circuit board.

*Description*

This invention relates to an apparatus for mounting electrical components such as resistors, capacitors, transistors, and the like to a circuit board.

Circuit boards are well known and comprise essentially a board of insulating material having a conductive material in the form of an electrical circuit suitably formed thereon. Often a printing process is employed to form the circuit on the board and the circuit produced thereby is commonly termed a printed circuit. It is common practice to attach prefabricated passive and active circuit elements such as resistors, capacitors, transistors, diodes, and the like to the printed circuit board, with the lead wires from such components soldered, welded or otherwise suitably joined to the conductor lines on the board. Often, holes are formed in the printed circuit panel and, in assembling the components on the panel, the component lead wires are inserted downwardly through the appropriate holes with the free ends of the wires extending from the bottom face of the board which carries the printed conductor lines. The extending lead wires are then cut off to the desired length and bent, or crimped, to mechanically fasten the components to the board. The board, with the components attached thereto by the lead wires is then inverted and the bent ends of the lead wires are welded, soldered or otherwise suitably secured to the conductive lines.

An object of this invention is the provision of an improved apparatus for attaching electrical components to a printed circuit board which apparatus does not necessitate bending or crimping of the component lead wires to attach the components the the board.

An object of this invention is the provision of an improved apparatus for use in attaching circuit components to a circuit board for holding said components in proper position against the board during attachment of the components to the board.

An object of this invention is the provision of an apparatus for holding one or more circuit boards and for clamping electrical components against the board to facilitate the joining of the component lead wires to the conductive lines of the circuit board.

The novel apparatus of this invention comprises a pair of spaced supporting members formed with facing grooves to slidably reecive the opposed edge portions of one or more printed circuit boards. The apparatus may be supported upon any suitable surface by legs extending from one side of the supporting members. The circuit board, or boards, are inserted into the grooves in the supporting members with the conducting lines facing downwardly and spaced above the supporting surface. The circuit components may then be properly located on the circuit board with the component lead wires extending downwardly through appropriate holes in the board. The apparatus includes a cover formed with a resilient pad which is placed over the electrical components in engagement therewith. Means are provided for urging the cover downwardly against the electrical components to compress the resilient pad portion of the cover. With the electrical circuit components so clamped to the board, the apparatus may be inverted such that the component lead wires extend upwardly for easy trimming and soldering.

In the drawings wherein like reference characters refer to the same parts in the several views.

Figure 1:
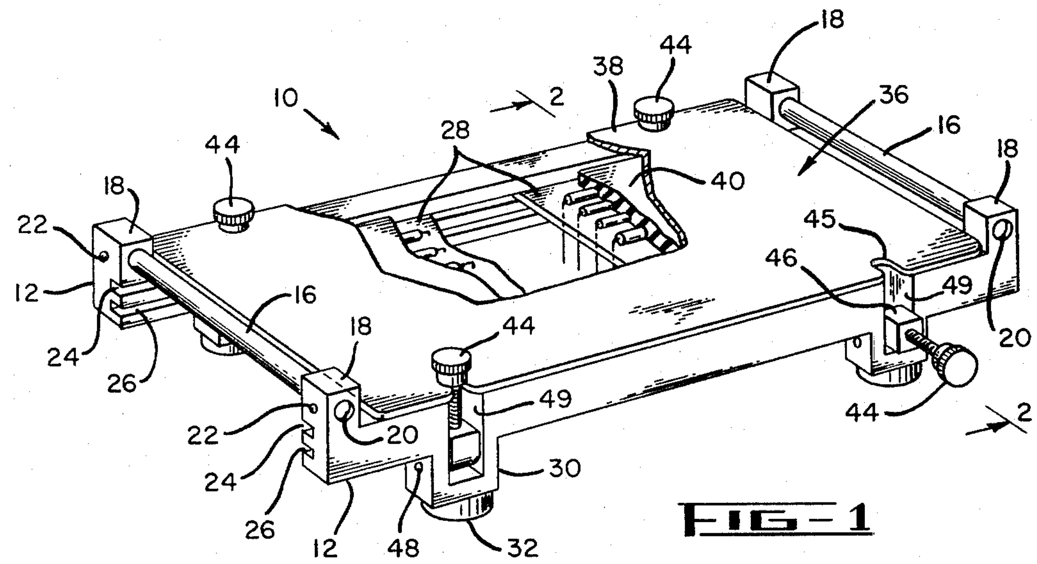
FIGURE 1 is a perspective view of the novel apparatus with parts thereof broken away to show circuit boards carried thereby.
Figure 2:
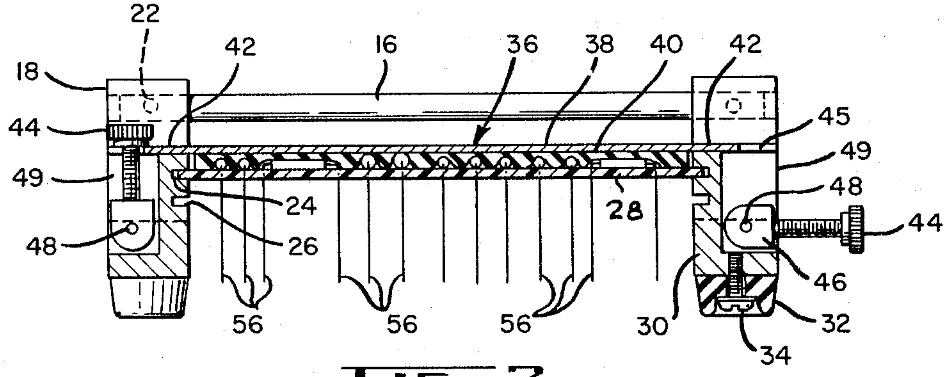
FIGURE 2 is a cross sectional view taken on line 2—2 of FIGURE 1.

Reference is now made to FIGURE 1 of the drawings wherein the novel apparatus designated 10 is shown comprising a frame which includes a pair of side supporting members 12 positioned a parallel spaced distance apart by end rods 16 extending therebetween at opposite ends thereof. Upwardly extending legs 18 are provided at opposite ends of the side members 12 through which holes 20 are formed into which holes the ends of the rods 16 extend. Set screws 22 in holes in the sides of the legs serve to fix the rods 16 in position. The spacing between the parallel side members 12 is adjustable to accommodate circuit boards of different width after first loosening the set screws.

The inwardly facing side walls of the side members 12 are provided with parallel grooves 24 and 26 which may extend the entire length of the members. The width of the grooves is sufficient to slidably receive the edges of the printed circuit boards 28. The side members 12 may be made any length to accommodate, one, two, three or more circuit boards as desired. In FIGURE 1, two circuit boards 28 are shown slidably engaged in the grooves 24 of the side rail members 12. Downwardly extending legs 30 are formed adjacent the opposite ends of the side members 12, which legs may be provided with resilient feet 32 attached by screws 34 to the ends thereof. During the initial portion of the assembly process the feet 32 support the apparatus on any suitable flat surface, not shown, such as a table or bench top, with the circuit boards 28 a spaced distance above such surface.

A cover 36 comprising a flat top plate 38 having a flexible, deformable, pad 40 at one face thereof is provided for covering the circuit boards to temporarily hold the electrical circuit components against the boards during soldering of the component lead wires to the circuit board conductors. The pad 40 may comprise a layer of rubber, foam rubber, resilient plastic or like resilient material which may be secured as by cementing or other suitable means not shown to one face of the plate 38. The longitudinal side edges 42 of the plate 38 extend outwardly beyond the edge of the pad 40, and with the cover in position on the apparatus frame, the side edges are clamped against the upper face of the side members 12 between the legs 18. Clamping screws 44 adapted to extend through notches 45 formed at opposite longitudinal edges of the plate 38 are used to secure the cover to the frame. The screws 44 threadedly engage tapped holes in anchor blocks 46, which blocks are pivotally mounted on pivot pins 48 extending between opposite side walls of notches 49 formed in the side frame members 12 at the legs 30. In FIGURE 1 three of the cover fastening screws 44 are shown in clamping position with the cover 36 and the fourth screw 44 is shown pivoted into an unclamped position. Obviously, any other suitable means may be used for fastening the cover 36 to the apparatus frame. For example, the cover could be pivotably secured to one frame side member 12 with a releasable latch for the cover at the other side member.

Figure 3:
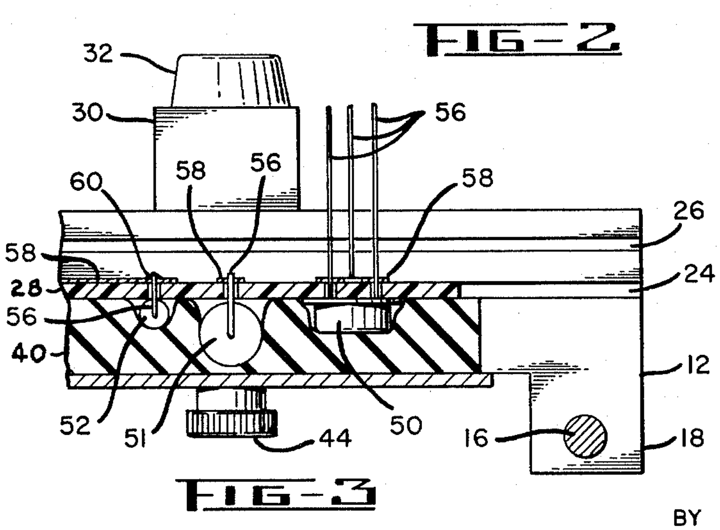
FIGURE 3 is an enlarged fragmentary sectional view of the apparatus and circuit boards shown in an inverted position for ready attachment of the component lead wires to the conductive lines on the circuit board.

With the cover 36 in operative position on the apparatus frame as illustrated in the drawings the prefabricated components which have been placed on the boards 28 are clamped to the boards by engagement with the pad 40. Without any components on the boards, the pad 40 preferably (but not necessarily) is of a sufficient thickness to engage the boards. Therefore, with the components positioned on the boards, the resilient pad is compressed thereat and exerts a downward pressure on the components to clamp the same against the boards. It will be readily apparent that because of the resiliency of the pad, the pad dimensions and the dimensions of the components are not critical in the function of the device. As seen in FIGURE 3 a transistor 50, cylindrical shaped capacitor 51 and resistor 52 of smaller size than the capacitor are shown held against the circuit board 28 by the pad. Lateral movement of the circuit elements is prevented by the component lead wires which extend through holes in the circuit board and by the clamping action of the pad on the components. For attaching larger electrical components to the boards, i.e., components of greater height than those illustrated, the circuit board or boards may be slid into the lower grooves 26 of the side frames 12 to provide an increased spacing between the cover plate 38 and circuit board. If all of the components to be attached are of a greater height a cover 36 with the same thickness pad 40 as illustrated could be employed. If shorter components along with the taller ones are to be attached to the boards, the pad would be sufficient thickness to engage the shorter ones also. Obviously, a cover having a pad with varying thickness could be employed. Also, the apparatus is not limited to use with any particular shaped components since the resilient pad accommodates the various shapes.

In the practice of the novel assembly method of this invention, the cover 36 is removed from the apparatus frame and the printed circuit board, or boards, are slid into the desired side frame grooves with the conductor lines on the boards facing downwardly. As is well understood, the boards with the circuit conductors thereon are generally preformed with holes therethrough to accommodate the lead wires of the prefabricated circuit components. With the circuit boards in position in the frame, the components are placed on the boards with the component lead wires designated 56, extending through the appropriate holes in the boards. The cover 36 is then placed on the device with the resilient pad portion 40 resting on the components. The screws 44 at the sides of the rails are swung into position in the notches 45 in the cover and are then tightened to draw the cover plate 38 toward the side frame members 12. During the clamping process the resilient cover pad 40 is compressed where the pad engages the electrical components to firmly and snugly clamp the components against the circuit boards. The pad is sufficiently soft to prevent damage to the components during the clamping process. The cover plate 38 is preferably clamped against the rails 12 at which time the proper pressure is exerted against the components. In some instances of use, the cover plate 38 may not engage the rails 12 before the proper clamping pressure on the components is achieved.

With the component parts clamped to the boards, the entire apparatus with the circuit boards and components clamped thereto is inverted to rest upon the legs 18. In the inverted position shown in FIGURE 3, the component lead wires 56 extend upwardly through the circuit boards and are readily accessible for cutting to proper length and joining to the conductor lines 58 (shown in greatly exaggerated dimension in FIGURE 3). The lead wires 56 for the transistor 50 are shown prior to trimming to proper length. A lead wire 56 for the capacitor 51 is shown after being cut off to the desired length. After cutting to the proper length, the lead wires 56 are soldered, welded, or otherwise suitably joined to the conductor lines 58 as illustrated by a lead wire from the resistor 52 which is shown soldered to the conductor lines as at 60. With this novel method, at no time is it necessary to bend or crimp the lead wires against the circuit board to hold the components in position during soldering. When all of the lead wires have been soldered the apparatus is turned over to rest upon the legs 30, the cover 36 is removed, and the assembled circuit boards are slid from the apparatus. The apparatus is then ready for re-use in the manner described above.

It will here be understood that the apparatus is well adapted for use in dip soldering the component leads to the printed circuit conductors. By making the side frame members 12 of aluminum or other suitable material, the apparatus may be submerged to the required depth for dip soldering the trimmed component leads to the circuit board.

In addition, because it is not necessary to bend the component lead wires to fasten the electrical components to the circuit board, defective components may be easily removed and replaced with operative components without having to straighten the bent lead wires of the defective components. It will here be understood, however, that the component lead wires may be bent, if desired, in fastening the components to the circuit boards.

Having now described the invention in detail in accordance with the requirements of the patent statutes, various changes and modifications may occur to those skilled in this art without departing from the spirit and scope of the invention as defined in the following claims.

We claim:

1. An apparatus for use in temporarily attaching electrical components having lead wires extending therefrom to a circuit board having conductive circuit means on at least one face thereof and holes formed through the board to accommodate the component lead wires while joining the lead wires to the conductive circuit means, said apparatus comprising, a supporting frame for supporting a circuit board with the one face of the board bearing the conductive circuit means facing downwardly and the other face of the board facing upwardly for support of electrical components placed thereon, a cover with a resilient pad for removably engaging electrical components carried on said other face of the circuit board, and means for attaching the cover to the supporting frame for compressing the pad at the electrical components to urge the components against the circuit board with sufficient force to maintain the electrical components against the board while joining the lead wires to the conductive circuit means.

2. The apparatus defined in claim 1 wherein said supporting frame comprises a pair of spaced members formed with grooves therein to slidably receive opposite edges of the circuit board.

3. The apparatus defined in claim 2 including means for adjusting the spacing between said spaced members to carry circuit boards of different width.

4. The apparatus defined in claim 1 including means to support the frame in a first generally horizontal position and in a second generally horizontal inverted position, the cover being adapted for attachment to the supporting frame in the first position thereof after which the apparatus with the circuit board and components may be inverted to the second position.

5. The apparatus defined in claim 4 wherein said means to support the frame comprises leg members extending from opposite sides of the frame.

6. An apparatus for use in mounting electrical components having lead wires extending therefrom to an insulated circuit board having a conductive circuit pattern on at least one face thereof and holes formed through the board to accommodate the component lead wires, said apparatus comprising, a frame which includes a pair of spaced supporting members for supporting a circuit board therebetween with the one face of the board bearing the conductive circuit pattern facing downwardly and the other face of the board facing upwardly for support of electrical components placed thereon, a cover comprising a flat plate with a resilient pad at one side thereof adapted for engagement with the electrical components supported on the circuit board, and means for urging the cover toward the circuit board with the pad against the components to compress the pad at the components and to clamp the components against the board with a force sufficient to maintain the components against the board when the apparatus is inverted.

7. The apparatus defined by claim 6 wherein the spaced supporting members are of a length to support a plurality of adjacent circuit boards therealong.

8. The apparatus defined by claim 6 including means on the frame for supporting the frame and circuit board carried thereby a spaced distance above a supporting surface.

References Cited

UNITED STATES PATENTS

| | | | |
|---|---|---|---|
| 1,567,254 | 12/1925 | Forsberg | 29—203 |
| 2,264,408 | 12/1941 | Rohr et al. | 29—203 |
| 2,361,139 | 10/1944 | White et al. | 29—150 |

THOMAS H. EAGER, *Primary Examiner.*